(12) United States Patent
Sørensen (10) Patent No.: US 8,558,535 B2
(45) Date of Patent: Oct. 15, 2013

(54) 3-PHASE FARADAY OPTICAL CURRENT SENSOR ASSEMBLY

(75) Inventor: Freddy Sørensen, Birkerod (DK)

(73) Assignee: Powersense A/S, Holte (DK)

( * ) Notice: Subject to any disclaimer, the term of this patent is extended or adjusted under 35 U.S.C. 154(b) by 334 days.

(21) Appl. No.: 12/999,573

(22) PCT Filed: Jul. 21, 2009

(86) PCT No.: PCT/EP2009/059364
§ 371 (c)(1),
(2), (4) Date: Dec. 16, 2010

(87) PCT Pub. No.: WO2010/010090
PCT Pub. Date: Jan. 28, 2010

(65) Prior Publication Data
US 2011/0084688 A1  Apr. 14, 2011

(30) Foreign Application Priority Data
Jul. 21, 2008 (EP) .................................... 08013088

(51) Int. Cl.
*G01R 31/00* (2006.01)
(52) U.S. Cl.
USPC .......................................................... 324/96
(58) Field of Classification Search
USPC .................................................. 324/96, 120
See application file for complete search history.

(56) References Cited

U.S. PATENT DOCUMENTS

| | | | | |
|---|---|---|---|---|
| 4,683,513 A * | 7/1987 | Miller | ............................. | 361/76 |
| 5,136,236 A * | 8/1992 | Bohnert et al. | ................. | 324/96 |
| 5,182,547 A * | 1/1993 | Griffith | ........................ | 340/664 |
| 5,202,621 A * | 4/1993 | Reischer | ....................... | 323/358 |
| 5,473,244 A * | 12/1995 | Libove et al. | ................. | 324/126 |
| 6,429,661 B1 * | 8/2002 | Schweitzer, Jr. | ............. | 324/539 |
| 6,680,662 B2 * | 1/2004 | Schauwecker et al. | ....... | 335/216 |
| 7,633,285 B2 * | 12/2009 | Rahmatian et al. | ........... | 324/107 |
| 2003/0146748 A1 | 8/2003 | Duncan et al. | | |
| 2005/0007092 A1* | 1/2005 | Bjorn | ............................. | 324/96 |

(Continued)

FOREIGN PATENT DOCUMENTS

EP 0597404 5/1994

OTHER PUBLICATIONS

International Search Report on related PCT application (PCT/EP2009/059364); International Searching Authority (EPO) dated Jan. 28, 2010.

(Continued)

*Primary Examiner* — Jermele M Hollington
*Assistant Examiner* — Demetrius Pretlow
(74) *Attorney, Agent, or Firm* — Klein, O'Neill & Singh, LLP (57) ABSTRACT

A method and a system are provided for fixing a Faraday optical current sensor in a suitable measurement position for measuring the current in a 3-phase cable that includes 3 individual section-shaped phase conductors insulated in relation to one another and encapsulated inside an insulator. The method includes providing a Faraday optical current sensor arrangement having 3 Faraday optical current sensors, each of which is fixed in a specific position outside the insulator; and providing a processing unit for calculating a current value from a magnetic field value. The method is performed by measuring 3 magnetic field values using each of the 3 sensors and calculating the current in each of the section-shaped phase conductors using the processing unit and the 3 magnetic field values.

21 Claims, 6 Drawing Sheets

(56) References Cited

U.S. PATENT DOCUMENTS

2005/0156587 A1* 7/2005 Yakymyshyn et al. ... 324/117 R
2006/0170410 A1 8/2006 Bjorn
2008/0179070 A1* 7/2008 Gouge et al. ................ 174/15.5
2009/0251308 A1* 10/2009 Schweitzer et al. ....... 340/539.1

OTHER PUBLICATIONS

Written Opinion on related PCT application (PCT/EP2009/059364); International Searching Authority (EPO) dated Jan. 28, 2010.

* cited by examiner

- - - - - Synchr fi
— · — · — Inverse fi
————— Inverse amp + synchr amp

3-PHASE FARADAY OPTICAL CURRENT SENSOR ASSEMBLY

CROSS-REFERENCE TO RELATED APPLICATION

This application is a national phase filing, under 35 U.S.C. §371(c), of International Application No. PCT/EP2009/059364, filed Jul. 21, 2009, the disclosure of which is incorporated herein by reference in its entirety.

FEDERALLY SPONSORED RESEARCH OR DEVELOPMENT

Not Applicable

BACKGROUND OF THE INVENTION 3-phase medium voltage cables are used in numerous applications for distributing electrical energy from generators or substations to consumers. 3-phase cables are typically used as a distribution network to feed electrical motors or power electronic equipment. In such a 3-phase cable network there is a need to measure the current being distributed to the consumer. The current must be measured to determine and log the power being transmitted to each consumer and to be able to react in case of malfunctions or failures such as a short-circuit occurring in the distribution network. Historically, cable networks were used for low voltage and medium voltage applications while overhead lines were used for high voltage applications due to the increased insulation requirements at higher voltages. However, overhead lines have the drawback of being more exposed to environmental influences such as storms, blizzards and the like. New developments of high voltage insulation materials and a greater dependence on interruption-free distribution networks lead to high voltage cables replacing overhead lines.

A 3-phase cable typically has the individual 3-phase conductors encapsulated inside a common insulator. Each phase conductor is individually insulated in relation to the other phase conductors inside the cable by being embedded in a high voltage insulating material. To achieve the efficient and well-known round shape of the cable, typically each phase conductor accommodates a section-shaped space inside the cable. A shield of conductive material typically encloses the insulated conductors. The shield is typically grounded and primarily used as a barrier for protecting the 3 phase conductors from damage and for protecting persons from electric shock in case of damage on the insulation. The shield is also used as a return path for the current, if needed.

To measure the current in a 3-phase cable, typically the cable needs to be interrupted and a measurement device such as a Rogowski coil or current transformer has to be attached to each phase separately. This is very cumbersome and also a security risk, since the outer insulation and the shield must be removed from the cable. For very high voltages it is not always possible to separate the phases, or the measurement equipment needed would occupy a very large space due to the large insulation distances needed. It would therefore be an advantage to be able to measure all 3-phase currents directly on the 3-phase cable.

An advantageous technology for measuring the current in a single phase has been described in the European patent application 08388018.7 filed on 30 May 2008, which has now been published as EP 2128631. In the above patent application a Faraday optical current sensor is used to measure the current in a single phase of a power line.

Faraday optical current sensors may be used for measuring a current in a nearby conductor. Faraday optical current sensors rely on the Faraday effect. The Faraday effect states that the rotation of a polarized light beam is proportional to the magnetic field component in the direction of the beam. A charge moving inside a conductor will produce a circular magnetic field around the conductor. Thus, by placing a Faraday optical current sensor parallel to the direction of the magnetic field lines the magnitude of the current may be measured.

Using a Faraday optical current sensor provides many advantages compared to conventional current measurement equipment such as current transformers, Rogowski coils and the like. One of the most important advantages is the fact that the Faraday optical current sensor may be constructed entirely from dielectric materials. This is especially important for high voltage applications since it gives the Faraday optical current sensor a substantial immunity against electric field disturbances. Another important advantage of the Faraday optical current sensor is that since it is galvanic and separated from the conductor, it does not influence the current in the conductor in any way. This almost eliminates the risk of a short-circuit of the conductor through the measurement system. One example of such a Faraday optical current sensor is the DISCOS® Opti module produced by the applicant company and described in U.S. Pat. No. 7,068,025, to which reference is made and which is hereby incorporated in the present specification by reference. Further examples may be found in the PCT applications WO 2006/053567 and WO 04/099798, which are both hereby incorporated in the present application by reference.

A Faraday optical current sensor comprises a sensor element being a magneto-optical part sensitive to magnetic fields and typically formed as a diamagnetic rod, fibre or similar made of a material exhibiting a high Faraday effect. This is understood to mean a material having a high Verdet constant. The Verdet constant is the proportionality constant of the Faraday effect and varies considerably between different materials. Tabulated values exist for various suitable materials. The angle of rotation of the polarized light may be described by the following formula:

$$\beta = V \times B \times d$$

where $\beta$ is the angle of rotation, d is the length of the path where magnetic field and light interact, B is the magnetic field in the direction of the light propagation and V is the Verdet constant. The magnetic field at a certain location outside a conductor may be calculated by using the following well-known formula:

$$B = \frac{\mu_0 I}{2\pi r}$$

where B is the magnetic field, $\mu_0$ is the magnetic constant, I is the current and r is the distance from the conductor.

The magneto-optical part may be supplied with polarized light from a light source such as a lamp or LED emitting linear polarized light in a specific wavelength. The light source may comprise a polarized filter for generating light with a specific linear polarisation. The light exiting the magneto-optical part may be detected and preferably converted to an electrical signal by a detection unit. The detection unit detects the rotation of the polarized light exiting the magneto-optical part. A control unit may evaluate the signal from the detection unit; perform the necessary error corrections and calculations to determine the current in the conductor. Possible sources of errors include sensor position in relation to the power line, optical noise, magnetic noise, transition effects when light enters and exits different optical media and temperature effects. The Faraday optical current sensor is preferably calibrated before use, e.g. by comparing measurement results to conventional current measurement equipment. Conventional current measurement equipment may comprise e.g. a current transformer. After calibration the Faraday optical current sensor may replace conventional measurement equipment for monitoring currents in the conductor. The Faraday optical current sensor may also be used to detect fault currents such as short-circuit currents and report such occurrences to a safety system, which may in turn activate the relevant circuit breakers and backup systems to avoid damage to other equipment in the power distribution network.

The magneto-optical part, the light source and the detection unit are preferably connected via an optical conduit such as an optical fibre. Optical fibres provide a substantial amount of flexibility and allow light to travel long distances without considerable losses in light intensity. However, it is important to be aware of the limits in flexibility of optical fibres. Optical fibres may fail due to being broken, damaged or deformed if they are bent beyond their flexibility limit. A failure in the optical fibre due to excessive bending will typically permanently make it unusable for conducting light. Typical optical fibres may be bent considerably less than electrical cables.

For better handling and protection against damage and ambient light sources, the magneto-optical part as well as the junctions with the ends of the optical conduits are encapsulated by a small cylindrical housing. All of the above features of the optical Faraday optical current sensors make a broad range of new measurement positions feasible.

Since optical sensors may be constructed by using only dielectric materials, the sensors may be positioned in locations where other sensors, i.e. sensors comprising conductive materials, are not suitable. Such locations include places subject to high electrical fields, which are common in high current and high voltage engineering. Additionally, the Faraday optical current sensors are very compact and light since they do not contain any metal parts. The magneto-optical part for high voltage and high current applications may be realized having dimensions in the mm range, compared to current transformers for high voltage application often having dimensions of several meters due to the safety distances needed for high voltage applications. Such large current transformers will be unable to measure the current accurately directly on a 3-phase high voltage cable. There is therefore a need for current measurement systems and methods for measuring the current directly on a 3-phase cable using a Faraday optical current sensor.

SUMMARY OF THE INVENTION

It is therefore an object according to the present invention to provide a method and a system for fixating a Faraday optical current sensor in a suitable measurement position for measuring the current in a 3-phase cable.

The above need and the above object together with numerous other needs and objects which will be evident from the below detailed description are according to a first aspect of the present invention obtained by a system for measuring the currents in a 3-phase cable, said 3-phase cable comprising 3 individual section-shaped phase conductors insulated in relation to one another and being encapsulated inside an insulator, said 3-phase cable defining a longitudinal dimension along said 3-phase cable and a radial dimension perpendicular to said longitudinal dimension, said system comprising:

a Faraday optical current sensor arrangement comprising 3 Faraday optical current sensors for measuring 3 magnetic field values, each Faraday optical current sensor being fixated in a specific position outside said section-shaped phase conductors, a processing unit for calculating a current value from a magnetic field value and for calculating the current in each of said section-shaped phase conductors by using 3 magnetic field values.

The section-shaped conductors should be separated by a layer of high voltage insulation thick enough to withstand the voltage difference to avoid any risk of the phases being short-circuited. The high voltage insulation should further be thick enough to prevent any short-circuit from the phases to the surrounding ground potential. The phase conductors may in principle have any shape, however, to form a round shape of the 3-phase cable the phase conductors are preferably made section-shaped. The longitudinal dimension is meant to represent the direction along the 3-phase cable, which is identical to the current path in the 3 section-shaped phase conductors. The radial dimension represents the outwards directions in relation to the 3-phase cable, perpendicular to the current path.

In this context, outside the conductors should be understood to mean outside the conductor itself but not necessarily outside the 3-phase cable. The Faraday optical current sensor may be placed and securely fixated outside the cable. Alternatively, the Faraday optical current sensor may be placed in a slot partly or fully inside the 3-phase cable. Yet another alternative may be to encapsulate the Faraday optical current sensor completely within the 3-phase cable. The specific position of the Faraday optical current sensor is understood to mean a position where a proper measurement result is achieved due to the working principle of the Faraday optical current sensor. The fixation may comprise a simple strip for fixating the Faraday optical current sensor permanently on the 3-phase cable. The processing unit may comprise a digital calculation unit such as a computer or the like running a calculation algorithm. Alternatively, an equivalent analogue device may be used. The Faraday optical current sensor may measure a magnetic field value at the position of the sensor element, which is located inside the Faraday optical current sensor. The value of the magnetic field at the position of the sensor element is depending on the current in each of the phase conductors. Consequently, by measuring the magnetic field at 3 different positions around the 3-phase cable, the current in each of the 3-phase conductors may be derived. Preferably, each Faraday optical current sensor is positioned close to a separate phase conductor. Primarily the closest phase conductor, however also the two distant phase conductors, will influence the Faraday optical current sensor. The Faraday optical current sensor arrangement is understood to encompass 3 Faraday optical current sensors each including a control unit for sending and receiving light signals and two optical conduits for transporting polarized light signals to and from each sensor element and each control unit. The Faraday optical current sensor preferably includes a housing surrounding the sensor element. The housing protects the sensor element and seals the sensor element from any ambient light sources outside the housing. The housing should provide an inlet and an outlet for receiving the provided optical conduits. The housing will block any light from escaping from the housing or entering the housing except via the provided optical conduits.

According to a further feature of the method according to the present invention, the Faraday optical current sensors may each define an individual light propagation direction and the method may further comprise the initial steps of:

positioning the Faraday optical current sensors annularly spaced by a specific angle around the 3-phase cable at an equal distance in relation to the longitudinal dimension and oriented such that the light propagation direction of the Faraday optical current sensor is oriented substantially perpendicular to both the longitudinal dimension and the radial dimension,     measuring 3 magnetic field values by using each of the 3 Faraday optical current sensors,     calculating a current value in each of the section-shaped conductors by using the processing unit and the 3 magnetic field values,     fixating the Faraday optical current sensors in an optimal measurement position where the arithmetic sum of the current values is maximized.

The positioning of the Faraday optical current sensors is critical for achieving best possible measurement results. The best measurement results are achieved in an optimal measurement position where each of the 3 Faraday optical current sensors is positioned at a position as close as possible to the centre of a separate phase conductor, i.e. in the symmetry line of a phase conductor. The Faraday optical current sensors should further be oriented such that the sensor elements, i.e. the light propagation directions, are parallel to the direction of the magnetic field. The magnetic field is well known from Biot-Savarts law to form a circular path around the current direction. When orienting the Faraday optical current sensor, and thereby the sensor element, in a direction perpendicular to both the longitudinal dimension and the radial dimension as stated above, the light propagation direction will intersect the tangential direction of the circular magnetic field direction.

By fixating the Faraday optical current sensors in a position where the arithmetic sum of the measured currents is maximized it can be ensured that the optimal measurement position is found. The Faraday optical current sensors may be rotated around the 3-phase cable until the optimal measurement position has been found. This holds true for both a synchronous and an inverse current system.

Alternatively, by applying the same reference voltage on all 3-phase conductors and calculating a power value from the measured currents, it can be ensured that the pure synchronous and/or the pure inverse system is measured by minimizing the sum of the power in all 3-phase conductors. Since the applied voltages are the same, it is well known that the sum of the power must be zero for a synchronous or alternatively an inverse system.

According to a further feature of the method according to the present invention the Faraday optical current sensors may be fixated outside the insulator contacting the outer surface of the 3-phase cable. By fixating the Faraday optical current sensor on the surface of the 3-phase cable, it can be ensured that the sensor element of the Faraday optical current sensor is positioned as close to the phase conductor as possible without needing to reduce the thickness and decrease the insulation properties of the high voltage insulation by making a groove or the like in the insulation. Preferably, the Faraday optical current sensor may have a groove or the like to adapt to the round shape of the 3-phase cable and to position the sensor element as close as possible to the phase conductor.

According to a further feature of the method according to the present invention the Faraday optical current sensors may be fixated by a frame. After calibration of the measurement system described above, the position of the Faraday optical current sensors must not be disturbed. Any disturbance of the position will inevitably lead to inaccurate measurement results, which may lead to catastrophic results in case of any failure in the distribution network. By providing a frame for fixating the Faraday optical current sensors a secure and permanent fixation can be ensured. Such frame may in its simplest form comprise a cage or the like surrounding the 3-phase cable at least partly and be able to securely attach to the 3-phase cable. A strip may be used for fixating the cage to the 3-phase cable. It is understood that the frame must be made of rigid and magnetically transparent material. Magnetically transparent material may be a diamagnetic or paramagnetic material. Preferably a diamagnetic and dielectric material is used such as plastic.

According to a further feature of the method according to the present invention the frame may comprise 3 plates, each plate having a fixated Faraday optical current sensor. To allow a secure fixation of both the Faraday optical current sensor and the optical conduits used for transporting the light signals to and from the sensor element, preferably both the Faraday optical current sensor as well as the parts of the optical conduits close to the Faraday optical current sensor are fixated to a plate. The 3 plates including the Faraday optical current sensors may subsequently be fixated to the 3-phase cable by e.g. a strip.

According to a further feature of the method according to the present invention the frame comprises a circular plate being mounted on the 3-phase cable substantially parallel to the radial dimension, the circular plate defining:

a centrally located hole for accommodating the 3-phase cable, the centrally located hole having a diameter approximately equal to the diameter of the 3-phase cable,     a detachable section having an angle of approximately 120 degrees, the 3 Faraday optical current sensors being fixated on the circular plate at approximately equal distance from the 3-phase cable.

By making the frame a solid plate structure, a permanent positioning of the Faraday optical current sensors is secured. With permanent positioning is meant substantially secure from accidental disturbances but possible to remove if needed. The above structure is compact and easy to assemble/disassemble due to the sectioned structure. It should be noted that the circular plate should have a certain width, i.e. extension in the longitudinal dimension, to allow a stable position. The circular plate may be fixated by using a strip surrounding the outer circumference of the circular plate. Thereby the 3-phase cable is securely clamped in the hole. The above structure may be employed together with the plate, where the plate extends outwards for fixating the optical conduits.

According to a further feature of the method according to the present invention the frame may comprise:

a first and a second circular plate being mounted on the 3-phase cable substantially parallel to the radial dimension and separated by a specific distance along the longitudinal dimension, each circular plate defining:

a centrally located hole for accommodating the 3-phase cable, the centrally located hole having a diameter approximately equal to the diameter of the 3-phase cable, and         a detachable section having an angle of approximately 120 degrees, and     3 longitudinal bars each having a fixated Faraday optical current sensor extending between the first and second circular plate substantially parallel to the longitudinal dimension and one of said longitudinal bars extending between the detachable section or of the first and second circular plate.

For more stability two circular plates may be used. The above structure is similar to the previous structure, however slightly less compact but offers more security and stability provided by the second circular plate. It also offers a better protection of the optical conduits since they may be attached to the bars. Alternatively, a plate may be used instead of or in addition to the bars.

According to a further feature of the method according to the present invention the Faraday optical current sensors may be fixated at substantially equal distance from the 3-phase cable in relation to the radial dimension and/or the longitudinal dimension. To allow a simple positioning and accurate calibration each Faraday optical current sensor should be placed at the same distance from its corresponding phase conductor. Additionally, the longitudinal position of the Faraday optical current sensors should be equal, since the phase conductors are intertwined and a shift in the longitudinal direction between the Faraday optical current sensors may yield a false measurement.

According to a further feature of the method according to the present invention the 3-phase cable may comprise a shield surrounding the section-shaped phase conductors. Typically 3-phase cables comprise a shield having earth potential. The shield normally does not carry any current but may act as a neutral conductor and as a protection for not allowing direct access to the phase conductors in case of accidental damage to the insulation. The current in the shield must be derived from the current measured in the phase conductors. For calculation purposes the shield may be treated as a structure comprising a number of sections each carrying an identical partial shield current. This will simplify the calculation of the influence of the shield current on the measurements.

According to a further feature of the method according to the present invention the 3-phase cable may comprise a neutral conductor. The methods described above are primarily used for high voltage applications. Such high voltage applications generally do not provide a neutral conductor. However, the methods may alternatively be used for low voltage applications, which do occasionally provide a fourth conductor known as the neutral conductor. The method described above is appropriate for low voltage applications as well. For such low voltage applications a fourth Faraday optical current sensor may be employed, or alternatively only 3 Faraday optical current sensors are employed for the 3-phase currents and the current in the neutral conductor is derived from the 3 measured phase currents.

According to a further feature of the method according to the present invention the Faraday optical current sensors are positioned annularly spaced by an angle of approximately 120 degrees around the 3-phase cable. Typically, the phase conductors in a 3-phase cable are separated by an angle of 120 degrees. Thus, the Faraday optical current sensors are preferably as well separated by 120 degrees.

According to a further feature of the method according to the present invention the current in the 3-phase cable is calculated by the following formula:

$I_1 = \text{Gain}(a) \cdot \phi(a) \cdot I_s + \text{Gain}(a) \cdot \phi(-a) \cdot I_i$ $I_2 = \text{Gain}(a) \cdot b^2 \cdot \phi(a) \cdot I_s + \text{Gain}(a) \cdot b \cdot \phi(-a) \cdot I_i$ $I_3 = \text{Gain}(a) \cdot b \cdot \phi(a) \cdot I_s + \text{Gain}(a) \cdot b^2 \cdot \phi(-a) \cdot I_i$ with $$b = \frac{1}{2} + j \cdot \frac{\sqrt{3}}{2},$$

$\phi(a) = \cos(f(a)) + j \cdot \sin(f(a))$ and $I_s$ and $I_i$ considered as vectors and where $I_s$ represents the synchronous system current, $I_i$ represents the inverse system current, Gain(a) represents a reduction factor depending on the offset angle and $\phi$ is the phase shift.

The measured currents in the 3 phases are calculated with sensors spaced by 120 degrees.

The measurement of a real load composed from a synchronous current system $I_s$ together with an inverse current system $I_i$ will depend on the offset angle a of the sensor. It should be noted that any load may be described as the sum of a synchronous and an inverse symmetrical current system.

The amplitude of the measured signal will be reduced by a factor Gain(a) depending on the offset angle a. The additional shift of the synchronous and inverse current system will be a function $\phi(a)$.

The above need and the above object together with numerous other needs and objects which will be evident from the below detailed description are according to a second aspect of the present invention obtained by a system for measuring the currents in a 3-phase cable, the 3-phase cable comprising 3 individual section-shaped phase conductors insulated relative to one another and being encapsulated inside an insulator, the 3-phase cable defining a longitudinal dimension along the 3-phase cable and a radial dimension perpendicular to the longitudinal dimension, the method comprising:

a Faraday optical current sensor arrangement comprising 3 Faraday optical current sensors for measuring 3 magnetic field values, each Faraday optical current sensor being fixated in a specific position outside the section-shaped phase conductors, and a processing unit for calculating a current value from the magnetic field value for each of the section-shaped phase conductors.

The above system is preferably used in combination with the above methods. The 3 section-shaped conductors are preferably made of metal such as aluminium or copper. The conductors are encapsulated in high voltage insulation such that no discharge between the phases or between any of the phases or the ground is possible. The 3-phase cable is typically placed in the ground but may alternatively be placed above ground. The insulation should be thick enough for safe handling of the cable. The Faraday optical current sensors have an inlet and an outlet for receiving an inlet optical conduit and an outlet optical conduit. The inlet and outlet optical conduit transport light signals to and from the control unit, which may be placed far from the measurement location. The control unit comprises a sender and a receiver. The sender may include a light source having a linear polarized filter. The receiver may analogously comprise a detection unit, i.e. a polarized filter and a light detector such as a light-sensitive semiconductor.

According to a further feature of the system according to the present invention the above system may comprise any of the features of the above method. It is evident that the above system may be used in combination with the previously described methods.

It is evident that the system and method above may be modified for phases other than 3, such as 2 or 4.

The technology described above is at the present time due to the relatively high cost of Faraday optical current sensors primarily employed for high voltage applications. High voltage in the present context means any voltage equal to or above 30 kV, such as 40 kV, 50 kV, 90 kV, 120 kV, 300 kV, 400 kV, 500 kV or higher. The technology is, however, not limited to high voltage, but may also be employed for low voltage applications. Low voltage would in the present context mean any voltage below 30 kV, such as 400V, 1 kV, 1.5 kV, 3.5 kV, 5 kV 10 kV or 15 kV.

BRIEF DESCRIPTION OF THE DRAWINGS

The invention is now to be further described with reference to the drawings, in which.

DETAILED DESCRIPTION OF THE INVENTION

Figure 1A:
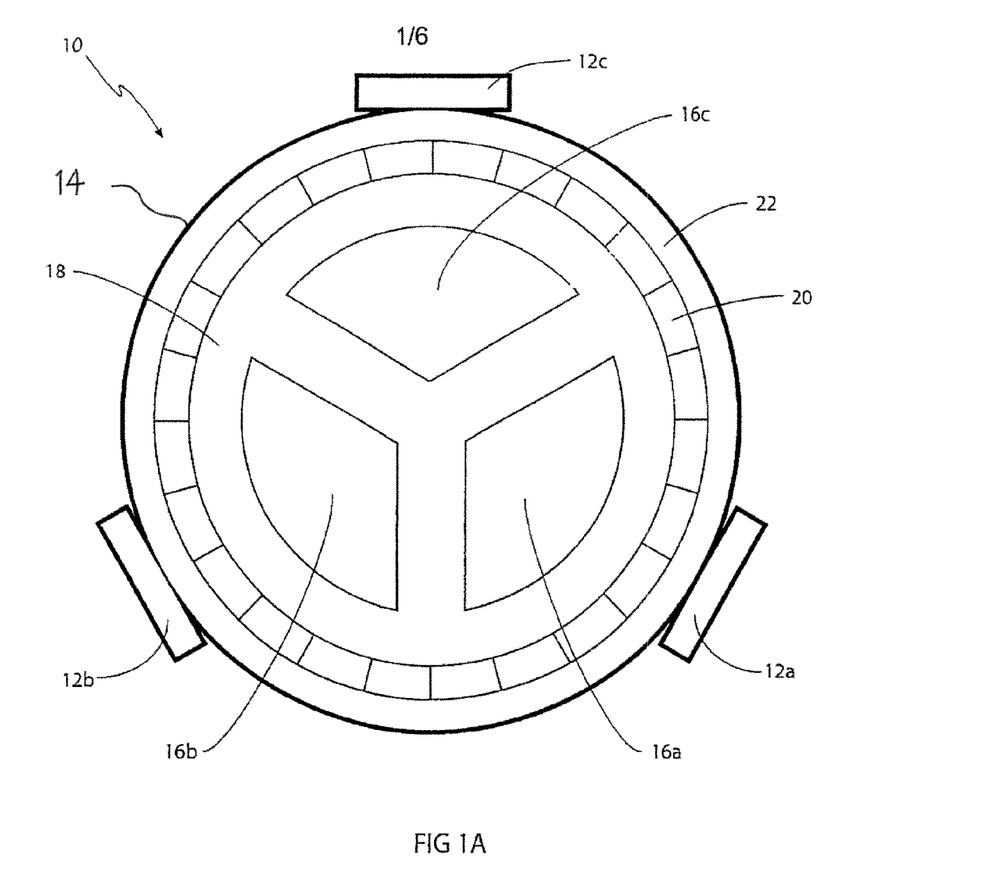
FIG. 1A is a schematic cross-sectional view of a 3-phase cable including a shield.

A detailed description of the figures of a presently preferred embodiment of the invention follows below:

FIG. 1A shows a cut-out view of a sensor assembly 10 comprising 3 Faraday optical current sensors 12a-c mounted on a 12 kV 3-phase cable 14. The 3-phase cable comprises 3 conductors 16a-c where each conductor 16a-c has a sectioned shape and is embedded in high voltage insulation 18. The high voltage insulation may be any proper insulating material and preferably either oil-impregnated paper or PEX. The high voltage insulation should be essentially magnetically transparent. Each conductor 16a-c represents one phase in the 3-phase cable. The conductors 16a-c are made of electrically conductive material, such as preferably copper or aluminium. Along the longitudinal direction of the cable, the conductors are typically braided, i.e. intertwined around each other. Each conductor 16a-c has an outward facing rounded surface and two inward facing surfaces having an angle of approximately 120 degrees. Each conductor 16a-c is completely encapsulated in high voltage insulation 18. The thickness of the high voltage insulation 18 may vary according to the material chosen and the rated voltage of the 3-phase cable 14. The thickness of the high voltage insulation 18 should be sufficient to withstand the potential difference between the conductors 16a-c.

The high voltage insulation 18 forms a circular outer surface, which is surrounded by a shield 20. The shield 20 may be divided into a plurality of separate shield sections such as 24 separate shield sections. The shield 20 may further be either solid or braided. The shield 20 should be made of electrically conductive and magnetically transparent material, such as preferably copper or aluminium. The shield is typically grounded. The shield 20 is encapsulated by an outer insulation 22, which preferably is made of solid insulation material such as polymer, e.g. PEX. The thickness of the outer insulation 22 should be sufficient to allow a safe handling of the cable and to prevent any discharge from the shield 20 to the outside. Additionally, the outer insulation should as well be magnetically transparent.

Each of the Faraday optical current sensors 12a-c is mounted outside the outer insulation 22 in a position near the corresponding section-shaped conductors 16a-c. The Faraday optical current sensors 12a-c are mounted in a position substantially perpendicular to the direction of the current. The Faraday optical current sensors 12a-c should be mounted at the same radial and longitudinal distance from the centre of the 3-phase cable 14, since the conductors 16a-c are intertwined. To achieve a high value of the signal, the radial distance should be as small as possible, i.e. the Faraday optical current sensors 12a-c should be placed on the outer surface of the 3-phase cable 14.

The magnitude of the magnetic field along the axis of the sensor can be calculated as the vectorial sum of the magnetic field generated from each of the currents in the 3 conductors 16a-c and the current in the shield 20. The magnetic field generated by the current in the shield may be calculated as the vectorial sum of the magnetic fields generated by each of the individual sections of the shield 20. In the present example 24 sections are used. It should be noted that the division of the shield in 24 sections is made here for simplifying the calculations. In reality the shield may be braided, have a number of separate section elements or comprise a single element. It is further assumed that the current is evenly distributed in the shield 20.

The magnetic field at the position of the Faraday optical current sensors 12a-c is inverse proportional to the distance from the centre of the conductor to the sensor element inside the Faraday optical current sensors 12a-12c. Only the magnetic field in the direction of the Faraday optical current sensors 12a-c is detected.

NUMERICAL EXAMPLE

The teachings according to the present invention have been applied to calculate the current in the 12 kV 3-phase cable 14 of FIG. 1. The 12 kV 3-phase cable 14 has the following numerical properties:
Thickness of the high voltage insulation: 5 mm
Shield 20 thickness: 1 mm
Outer insulation 22 thickness: 3.5 mm
Overall diameter: 57 mm From the above numerical properties, the relative theoretical contribution to the magnetic field from the 3-phase currents and the shield at the position of the sensor element along the direction of the sensor element may be determined. The relative theoretical contribution to the magnetic field measured by the Faraday optical current sensor 12a positioned juxtaposed the conductor 16a of phase 1 has been listed below.
Phase 1: 100%
Phase 2: 55%
Phase 3: 55%
Shield: 70%

The contribution to the magnetic field from phase 1 has been designated 100%. Each contribution is considered a vector component. The values for a different Faraday optical current sensor 12b-c may be calculated analogous.

3 Faraday optical current sensors may be placed in a fixed setup spaced by 120 degrees around the 12 kV 3-phase cable 14 with equal radial and axial distance relative to the centre of the 12 kV 3-phase cable 14. The sensors are rotated until the signal of the sensor is maximized. This implies the sensor to be placed at the symmetry line of the section-shaped conductor juxtaposed the 12 kV 3-phase cable 14. The numerical measurements are found in the table below:

| Phase 1 | | | Phase 2 | | | Phase 3 | | |
|---|---|---|---|---|---|---|---|---|
| Actual | Measured | | Actual | Measured | | Actual | Measured | |
| Magnitude [A] | Magnitude [A] | Phase angle [°] | Magnitude [A] | Magnitude [A] | Phase angle [°] | Magnitude [A] | Magnitude [A] | Phase angle [°] |
| 50 | 50 | 180 | 0 | 24 | 176 | 0 | 28 | 180 |
| 0 | 28 | 60 | 50 | 51 | 60 | 0 | 24 | 61 |
| 0 | 21 | 303 | 0 | 24 | 303 | 50 | 50 | 301 |
| 50 | 25 | 171 | 50 | 26 | 68 | 50 | 23 | 296 |

From the table above it can be seen that a 50 A current in phase 1 contributes 48% to the measurement of phase 2 and 56% to the measurement of phase 3. A 50 A current in phase 2 contributes 56% to the measurement of phase 1 and 48% to the measurement of phase 3. A 50 A current in phase 3 contributes 42% to the measurement of phase 1 and 48% to the measurement of phase 2. Thus, the overall average contribution from one phase to the measurement of another phase is 50% according to the measurements. This should be compared with the theoretical value, which was determined to be 55% above.

Figure 1B:
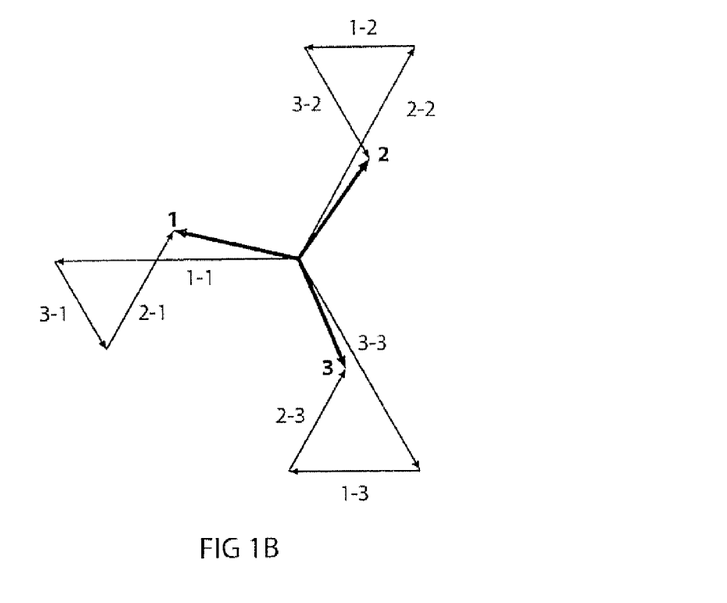
FIG. 1B is a vector diagram describing the influence of each of the 3-phase currents on the measurement of each phase, FIGS. C-1D show a current system in a 3-phase cable.

FIG. 1B shows a vector diagram describing the influence of each of the 3-phase currents on the measurement of each phase. Applying a 50 A current to each of the phase conductors will result in a measured current of 25 A, 26 A and 23 A. This is illustrated graphically in FIG. 3, where the vectors 1, 2 and 3 are representing the resulting vectors. The vectors named 1-1, 1-2 and 1-3 represent the contribution from phase 1 to the measurement of phase 1, 2 and 3 respectively. The vectors named 2-1, 2-2 and 2-3 represent the contribution from phase 2 to the measurement of phase 1, 2 and 3, respectively. The vectors named 3-1, 3-2 and 3-3 represent the contribution from phase 3 to the measurement of phase 1, 2 and 3, respectively.

Any load current on a 3-phase cable may be described as a combination of 3 independent load current systems:
1. A synchronous system having 3 currents equal in amplitude separated by 120 electrical degrees and rotating anti-clockwise.
2. An inverse system having 3 currents equal in amplitude separated by 120 electrical degrees and rotating clockwise.
3. A zero sequence system having 3 currents equal in amplitude and phase and not rotating. The zero sequence current is the only current system having a return path through the shield.

The magnetic fields from the synchronous current system is a synchronous magnetic field system having a reduced amplitude, but the same phase position in relation to the magnetic field generated by a single alternating phase current. In other words, a synchronous current may be measured as a synchronous current with reduced amplitude, but correct phase position. In the example above the numerical value of the amplitude will be (100%−55%), i.e. 45%

Concerning the inverse current system an inverse current may be measured as an inverse current with reduced amplitude, but correct phase position. It should be noted that the reductions in amplitude for the synchronous and inverse current system are the same.

The magnetic field from the zero sequence current system is a zero sequence magnetic field system having a phase and amplitude different from the zero sequence current system. In the example above the numerical value of the amplitude will be (100%-3*70+55%), i.e. −55%. This means the zero sequence current is measured as a zero sequence current having a reduced amplitude (55%) and a phase shift of 180 electrical degrees.

Figure 1C:
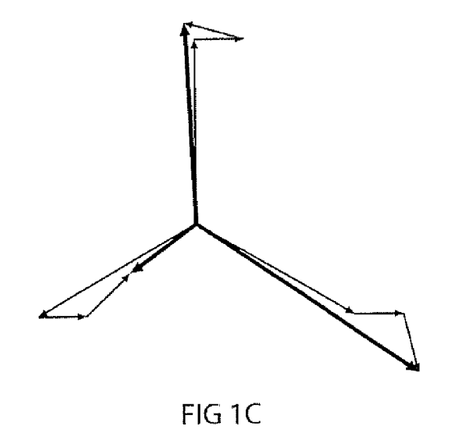
Figure 1D:
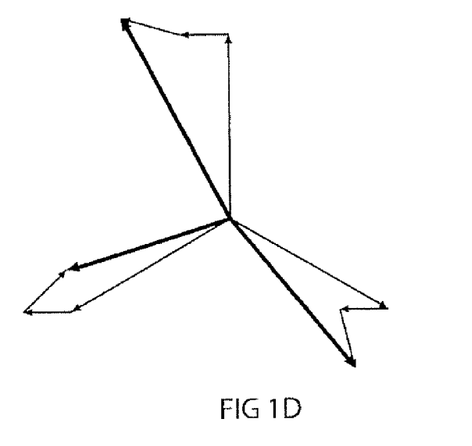

FIGS. 1C-1D show a current system in a 3-phase cable, where 1C shows the actual current values and 1D shows the measured current values. The figures are not showing the correct scale, but the angles are correct. The current system in the cable has a very high zero sequence current (20% of the phase current). This means the shield current is approximately 50% of the phase current.

The following steps may thus perform the calibration of the Faraday optical current measurements assembly on a 3-phase cable:
1. Placing the 3-phase sensor in a dummy 3-phase setup.
2. Calibrating each Faraday optical current sensor by applying a current to only the nearby phase conductor and adjusting the resulting current to 100%
3. Applying a synchronous current to all phase conductors and deriving the resulting gain factor $G_{synchronous}$ as the mean value of the measured currents divided by the applied currents.
4. Applying an inverse current to all phase conductors and deriving the resulting gain factor $G_{inverse}$ as the mean value of the measured currents divided by the applied currents.
5. Applying a zero sequence current to all phase conductors with the shields as the return path and deriving the resulting gain factor $G_{zero}$ as the mean value of the measured currents divided by the applied currents. The zero sequence current must be phase-shifted by either 0 or 180 electrical degrees.

3-phase measurement may subsequently be performed and the measured values may be transformed into a synchronous, an inverse and a zero sequence current system. Each magnetic field system is transformed into a current system by division with the relevant gain factor. The zero sequence system must additionally be phase-shifted by 0 or 180 electrical degrees.

The following initial steps may preferably be used to position and install the Faraday optical current sensor assembly:
1. Placing the 3 sensors on the 3-phase cable.
2. Fixating the sensors in a position where the arithmetic sum of the currents is at maximum.

The above procedure will yield the best position of the sensor, since the current from a synchronous current system is maximized. This holds true for the inverse current system as well. This means in the above position the sensor will give a maximal response and will represent the synchronous as well as the inverse current system without any phase shift. This is the simplest way of installing the sensor since no voltage is needed.

The following initial steps may alternatively be used to position and install the Faraday optical current sensor assembly:
1. Placing the 3 sensors on the 3-phase cable.
2. Applying the same single phase voltage to all 3 phases and rotating the sensors around the axial direction of the cable 3. Fixating the sensors in a position where the sum of power is equal to zero or alternatively as close to zero as possible.

The above procedure will as well yield the best position of the sensor, since the power from a synchronous current system when using the same voltage on all 3 phases is equal to zero. This holds true for the inverse current system as well. Zero power means the measured current system only holds synchronous and inverse currents, and this is the case only when the current sensors are in the correct position.

Figure 2A:
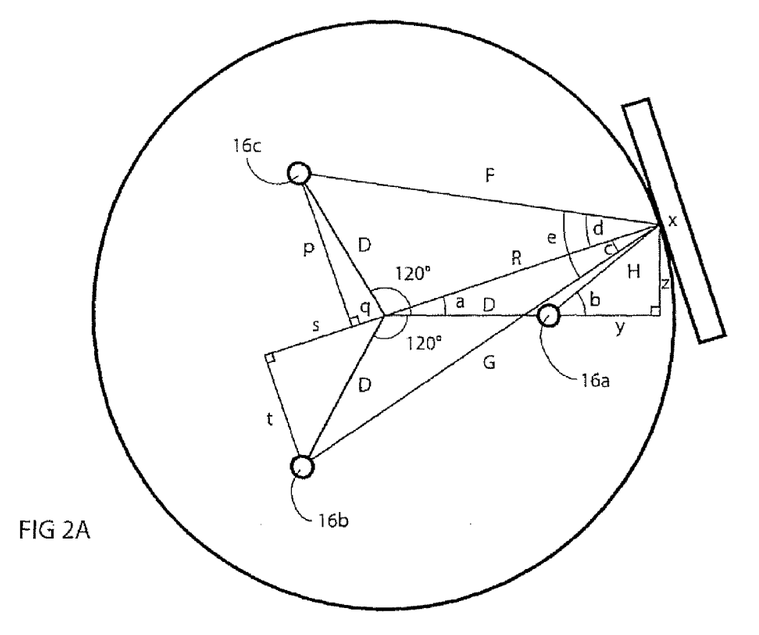
FIG. 2A is a schematic cross-sectional view of a mathematical model of a 3-phase cable without shield.

FIG. 2A shows a schematic view of the general geometry of a 3-phase cable without a shield, with an attached Faraday optical current sensor. The outer circle represents possible Faraday optical current sensor positions at the outer surface of the 3-phase cable. The sensor position X is located a distance R from the centre of the 3-phase cable and at an offset angle a. The current sensor will be influenced by the current in each of the conductors 16*a-c*. The magnetic field at the position of the current sensor X is the sum of the contributions from each of the conductors 16*a-c*. The contribution from each of the conductors 16*a-c* is proportional to the electrical current in the conductors 16*a-c* and inversely proportional to the distance F, G, H from the conductors 16*a-c* to the position X. The distances F, G, H are determined from the sensor element of the current sensor to the centres of the conductors 16*a-c*. The centre of each of the conductors 16*a-c* may be determined to be the centre of mass in the 2 dimensional cut-out view.

Further, the Faraday optical current sensor may only detect the magnetic field in the axial direction of the sensor element, i.e. in the direction of the light beam through the sensor element. It is assumed that the current sensor is positioned in a tangential direction outside the outer insulation 22. Thus, only the component of a magnetic field parallel to the optical current sensor, i.e. in the tangential direction, will be detected.

The angle between two conductors 16*a-c* is generally 120 degrees. By using the law of cosine it is possible to derive the distances from the centre of the conductors 16*a-c* to the Faraday optical current sensor as follows:

$$H = \sqrt{R^2 + D^2 - 2 \cdot R \cdot D \cdot \cos(a)}$$

$$F = \sqrt{R^2 + D^2 + 2 \cdot R \cdot D \cdot \cos(60+a)}$$

$$G = \sqrt{R^2 + D^2 + 2 \cdot R \cdot D \cdot \cos(60-a)}$$

Further, the angles c, d, e between the magnetic field lines of each conductor 16*a-c* and the direction of the Faraday optical current sensor may be calculated as below:

$$c = -a + \arctg\left(\frac{R \cdot \sin(a)}{R \cdot \cos(a) - D}\right)$$

$$d = \arctg\left(\frac{D \cdot \sin(60+a)}{D \cdot \cos(60+a) + R}\right)$$

$$e = \arctg\left(\frac{D \cdot \sin(60-a)}{D \cdot \cos(60-a) + R}\right)$$

The contribution to the magnetic field at the position X of the Faraday optical current sensor is proportional to the current in the conductors 16*a-c*, and inversely proportional to the distance F, G, H from the conductors 16*a-c*. The direction of the magnetic field is not necessary parallel to the direction of the Faraday optical current sensor. The magnitude of the contribution to the magnetic field is therefore reduced by a factor $\cos(\alpha)$, where $\alpha$ represents the angle a, b, c between the magnetic field lines from each conductor 16*a-c* and the direction of the Faraday optical current sensor. The contribution to the magnitude M of the magnetic field from each conductor 16*a-c* (designated H, G, F below) may be calculated as follows:

$$M_H = k \cdot \cos(c) \cdot \frac{I}{H}$$

$$M_F = k \cdot \cos(d) \cdot \frac{I}{F}$$

$$M_G = k \cdot \cos(e) \cdot \frac{I}{G}$$

where k is a proportionality constant, I is the current through the conductor, H, F and G are the distances between the optical current sensor and the respective conductors, and c, d, and e are the respective angles between the direction of the magnetic field and the direction of the Faraday optical current sensor.

The magnitude of the contribution to the magnetic field will vary in time according to the phase angle of the electrical current.

The resulting time dependence of the magnetic field from a 3-phase synchronous current system (I cos (ωt)) will therefore be according to below:

$$M = k \cdot I \cdot \cos(\varpi t + \varphi) \cdot \sqrt{\left(\frac{\cos(c)}{H} + \cos\left(\frac{2\pi}{3}\right) \cdot \frac{\cos(d)}{F} + \cos\left(\frac{\pi}{3}\right) \cdot \frac{\cos(e)}{G}\right)^2 + \left(\frac{\cos(c)}{H} + \sin\left(\frac{2\pi}{3}\right) \cdot \frac{\cos(d)}{F} + \sin\left(\frac{\pi}{3}\right) \cdot \frac{\cos(e)}{G}\right)^2}$$

with the phase shift:

$$\varphi = \arctg\left(\frac{\frac{\cos(c)}{H} + \sin\left(\frac{2\pi}{3}\right) \cdot \frac{\cos(d)}{F} + \sin\left(\frac{\pi}{3}\right) \cdot \frac{\cos(e)}{G}}{\frac{\cos(c)}{H} + \cos\left(\frac{2\pi}{3}\right) \cdot \frac{\cos(d)}{F} + \cos\left(\frac{\pi}{3}\right) \cdot \frac{\cos(e)}{G}}\right)$$

The resulting time dependence of the magnetic field from a 3-phase inverse current system (I cos (ωt)) will consequently be according to below:

$$M = k \cdot I \cdot \cos(\varpi t + \varphi) \cdot$$
$$\sqrt{\left(\frac{\cos(c)}{H} + \cos\left(\frac{\pi}{3}\right) \cdot \frac{\cos(d)}{F} + \cos\left(\frac{2\pi}{3}\right) \cdot \frac{\cos(e)}{G}\right)^2 + \left(\frac{\cos(c)}{H} + \sin\left(\frac{\pi}{3}\right) \cdot \frac{\cos(d)}{F} + \sin\left(\frac{2\pi}{3}\right) \cdot \frac{\cos(e)}{G}\right)^2}$$

with the phase shift:

$$\varphi = \arctg\left(\frac{\frac{\cos(c)}{H} + \sin\left(\frac{\pi}{3}\right) \cdot \frac{\cos(d)}{F} + \sin\left(\frac{2\pi}{3}\right) \cdot \frac{\cos(e)}{G}}{\frac{\cos(c)}{H} + \cos\left(\frac{\pi}{3}\right) \cdot \frac{\cos(d)}{F} + \cos\left(\frac{2\pi}{3}\right) \cdot \frac{\cos(e)}{G}}\right)$$

Figure 2B:
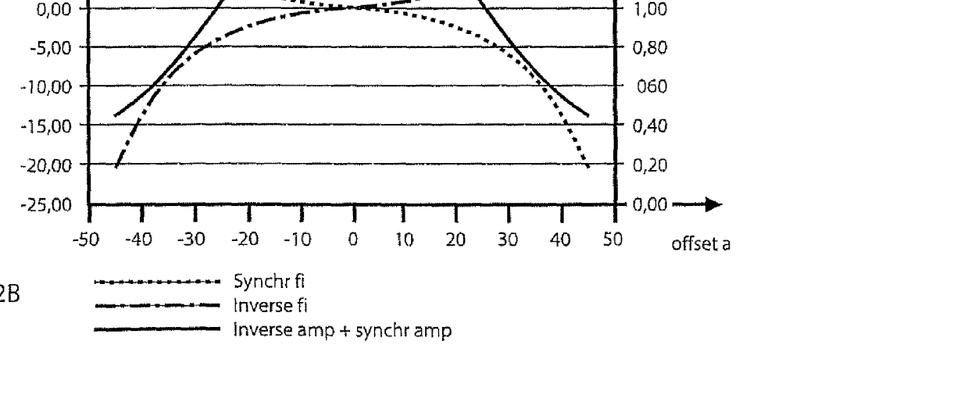
FIG. 2B is a graph showing a numerical example.

In FIG. 2B is shown a numerical example with R=1, D=0.7, k=0.5 and I=2. The amplitude of a synchronous and an inverse current system is identical and has a maximum at an offset angle a=0 degrees. The phase shift $\phi$ of a synchronous current system is in opposite direction of the phase shift of an inverse system and both are 0 at an offset angle a=0 degrees.

The measurement of a real load composed from a synchronous current system $I_s$ together with an inverse current system $I_i$ will depend on the offset angle a of the sensor. It should be noted that any load may be described as the sum of a synchronous and an inverse symmetrical current system.

The amplitude of the measured signal will be reduced by a factor Gain(a) depending on the offset angle a. The additional shift of the synchronous and inverse current system will be a function $\phi$(a). The measured currents in the 3 phases with sensors spaced 120 degrees apart will thus be:

$I_1$=Gain(a)·$\phi$(a)·$I_s$+Gain(a)·$\phi$(−a)·$I_i$ $I_2$=Gain(a)·$b^2$·$\phi$(a)·$I_s$+Gain(a)·$b$·$\phi$(−a)·$I_i$ $I_3$=Gain(a)·$b$·$\phi$(a)·$I_s$+Gain(a)·$b^2$·$\phi$(−a)·$I_i$ with $$b = \frac{1}{2} + j \cdot \frac{\sqrt{3}}{2},$$

$\phi$(a)=cos(f(a))+j·sin(f(a)) and $I_s$ and $I_i$ considered as vectors. f(a) represents the angle between the current sensor and the symmetry line of the phase conductor. Placing the sensors in the symmetry line of the conductor yields a maximal Gain(a), since f(a)=0, f(−a)=0 and $\phi$(a)=1. This leads to a maximized response signal and a simple signal processing.

The sum of the currents is:

$I$=|$I1$|+|$I2$|+|$I3$|=Gain(a)·[|$\phi$(a)·$I_s$+$\phi$(−a)·$I_i$|+
|$b^2$·$\phi$(a)·$I_s$+$b$·$\phi$(−a)·$I_i$|+|$b$·$\phi$(a)·$I_s$+$b^2$·$\phi$(−a)·$I_i$|]

The derivate of the sum of the currents I with respect to the angle a is:

$dI/da$=Gain'(a)·[|$\phi$(a)·$I_s$+$\phi$(−a)·$I_i$|+|$b^2$·$\phi$(a)·$I_s$+
$b$·$\phi$(−a)·$I_i$|+|$b$·$\phi$(a)·$I_s$+$b^2$·$\phi$(−a)·$I_i$|]+Gain(a)·[|$\phi$'(a)·$I_s$+$\phi$'(−a)·$I_i$|+|$b^2$·$\phi$'(a)·$I_s$+$b$·$\phi$'(−a)·$I_i$|+
|$b$·$\phi$'(a)·$I_s$+$b^2$·$\phi$'(−a)·$I_i$|]

where Gain'(a) denotes the derivate of Gain(a) with respect to a.

Figure 3:
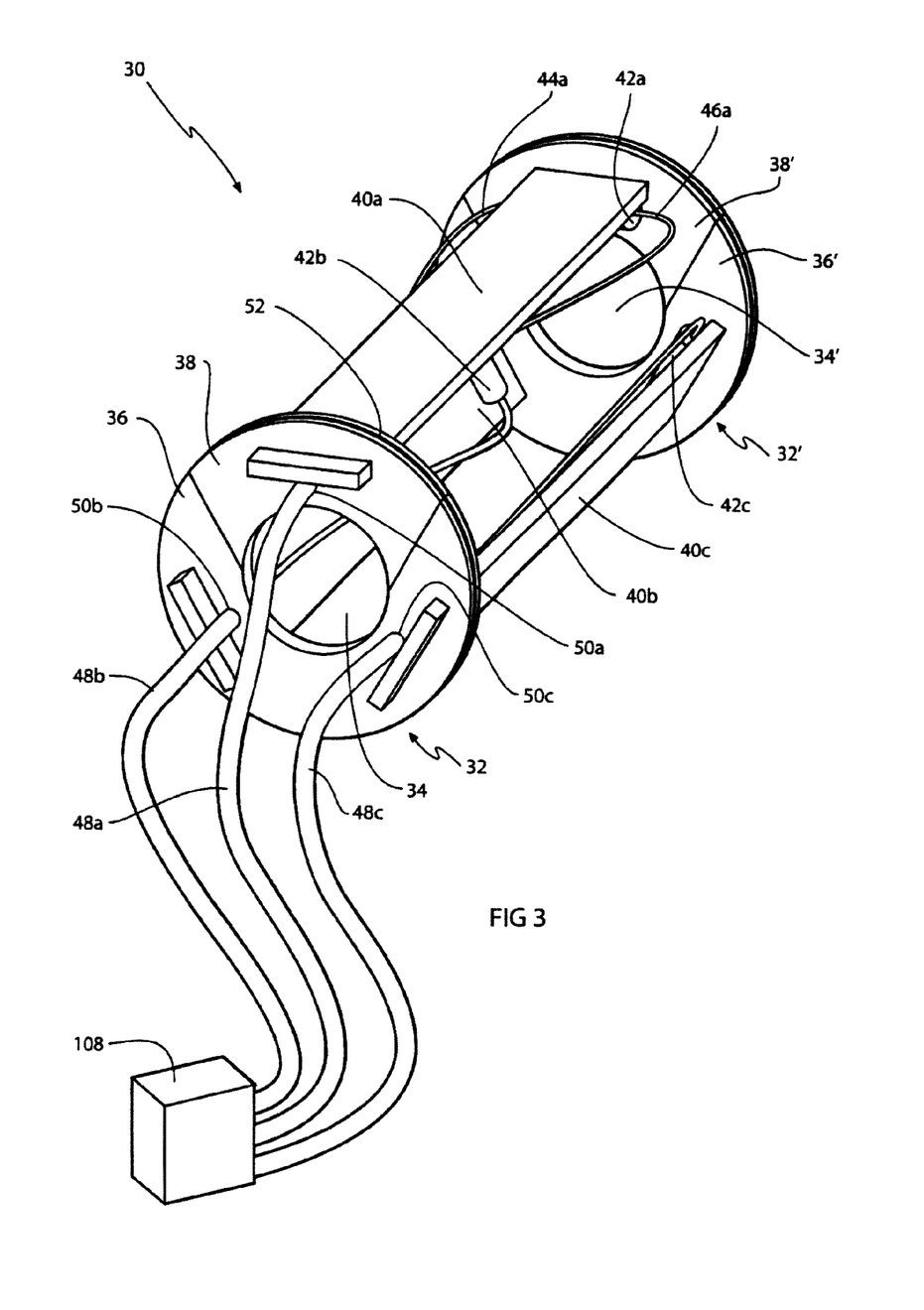
FIG. 3 is a 3D perspective view of a holder for a Faraday optical current measurement system.

FIG. 3 shows a 3D perspective view of a currently preferred embodiment of a 3-phase measurement assembly 30 according to the present invention. The measurement assembly comprise a first circular plate 32 and a second circular plate 32'. The first circular plate 32 and the second circular plate 32' each define a centrally located hole 34 and 34'. The centrally located holes 34, 34' should have a diameter substantially equal to the diameter of the 3-phase cable (not shown) for which the measurement assembly 30 is intended. This requires a different size of the centrally located holes 34, 34' and thereby a separate measurement assembly for each size of a 3-phase cable. This does not generally pose a problem since 3-phase cables for high voltage applications are provided in a limited number of standardized sizes for different voltage and current ratings. Optionally, the holes 34 and 34' may be lined or coated with a flexible and compressible seal (not shown). The seal will allow small variations in the diameter of the 3-phase cable due to tolerances in manufacturing or alternatively to allow different cable types to be used together with the same measurement assembly 30. The seal may e.g. be made of elastomeric material such as rubber or alternatively a foam material such as polymer foam.

Each of the first and second circular plates 32, 32' may be separated into a primary section 36, 36' and a secondary section 38, 38'. The primary section 36, 36 corresponds to approximately 120 degrees of the first circular plates 32, 32' and the secondary section 38, 38' corresponds to approximately 240 degrees of the first circular plates 32, 32'. The primary and secondary sections 36, 36', 38, 38' may be separated when the measurement assembly 30 is installed and removed from the 3-phase cable.

The primary sections 36, 36' are joined by a first rectangular plate 40a extending in a longitudinal direction perpendicular to the surface of the primary sections 36, 36'. Similarly, the secondary sections 38, 38' are joined by a second and a third rectangular plate 40b, 40c. Preferably rectangular holes are made in the circular plates 32 and 32' corresponding to the rectangular plates 40a-c. The rectangular plate may then be fed a short distance through the circular plate. This way small adjustments in the longitudinal direction may be performed. A separate fastening device may be employed to release and secure the rectangular plates 40a-c. Alternatively, the rectangular plates 40a-c are permanently fixated by adhesive. Each rectangular plate 40a-c has a Faraday optical current sensor 42a-c attached, preferably near the second circular plate 32'. The Faraday optical current sensors 42a-c are fixated to the inner surface of the rectangular plates 40a-c and oriented in a direction substantially perpendicular to the elongation of the rectangular plates 40a-c. The Faraday optical current sensors 42a-c should be located at the same longitudinal and radial distance in relation to the 3-phase cable, preferably such that the Faraday optical current sensors 42a-c are in contact with the 3-phase cable and more preferably such that the Faraday optical current sensors 42a-c apply a slight pressure on the 3-phase cable. Applying a slight pressure on the Faraday optical current sensors and thereby clamping them between the 3-phase cable and the rectangular plate will secure the position of the Faraday optical current sensors 42a-c. Preferably, the outer surface of the Faraday optical current sensor is made to correspond to the surface of the cable, and the Faraday optical current sensor is preferably shaped such that the sensor element is located as close to the 3-phase cable as possible. Each Faraday optical current sensor 42a-c is fed by an input optical conduit 44a-c made of an optical fibre or the like entering the Faraday optical current sensors 42a-c at a first end and delivering polarized light from a control unit (not shown). The light passes through a Faraday optical sensor element inside each of the Faraday optical current sensors 42a-c. The light exits at a second end opposite the first end of the Faraday optical current sensors 42a-c through an output optical conduit 46a-c as well made of an optical fibre or the like. The output optical conduit 46a-c transports the polarized light back to the control unit (not shown).

Each corresponding pair of input and output optical conduit 44a, 46a, 44b, 46b, 44c, 46c is fed into 3 flexible hoses 48a-c, which are preferably made of elastomeric material and used for protecting the sensitive optical conduits from dirt, dust, sunlight and similar environmental effects. Care should be taken not to bend the optical conduits 44a, 46a, 44b, 46b, 44c, 46c excessively. The hoses 48a-c are permanently fixated to each corresponding rectangular plate 40a-c by a set of straps or similar structures (not shown) and extend through holes 50a-50c, respectively, in the first circular plate 32. The hoses 48a-c preferably protect the optical conduits 44a, 46a, 44b, 46b, 44c, 46c along the path from the measurement assembly 30 to the control unit (not shown). Over the last small distance near the Faraday optical current sensors 42a-c, the input and output optical conduits 44a, 46a, 44b, 46b, 44c, 46c will remain unprotected, since they separate and enter two opposite ends of the Faraday optical current sensors 42a-c.

The material used for the above assembly may be any solid and magnetically transparent material, however, preferably a polymer material is used such as plastics due to its durability, light weigh and isolative properties. The control unit (not shown) is used to deliver and receive polarized light, determine the change in polarization and calculate the current in each conductor respectively.

To mount the measurement assembly 30 it should be separated into two sections, a primary section 36, 36' and a secondary section 38, 38'. The 3-phase cable is fitted between the primary section 36, 36' and the secondary section 38, 38' inside the centrally located hole 34 34'. Then the whole assembly is rotated to find the optimal measurement position as previously described. When the optimal measurement position is found, the measurement assembly 30 may be clamped permanently to the 3-phase cable. This may be done by using a plastic strap or band (not shown) to surround the circular plates along the outer surfaces of the circular plates 32, 32'. This way the two sections will be securely attached and at the same time a fixation force is applied by fastening the strap from the circular plate to the 3-phase cable. A groove (not shown) may be used for allowing the strap to be securely positioned on the relatively small outer surface of the circular plates 34, 34'. Alternatively, a strap (not shown) may be fastened surrounding the 3 rectangular plates 40a-c. Alternatively to a strap, a strip or a rubber band may be used.

Figure 4:
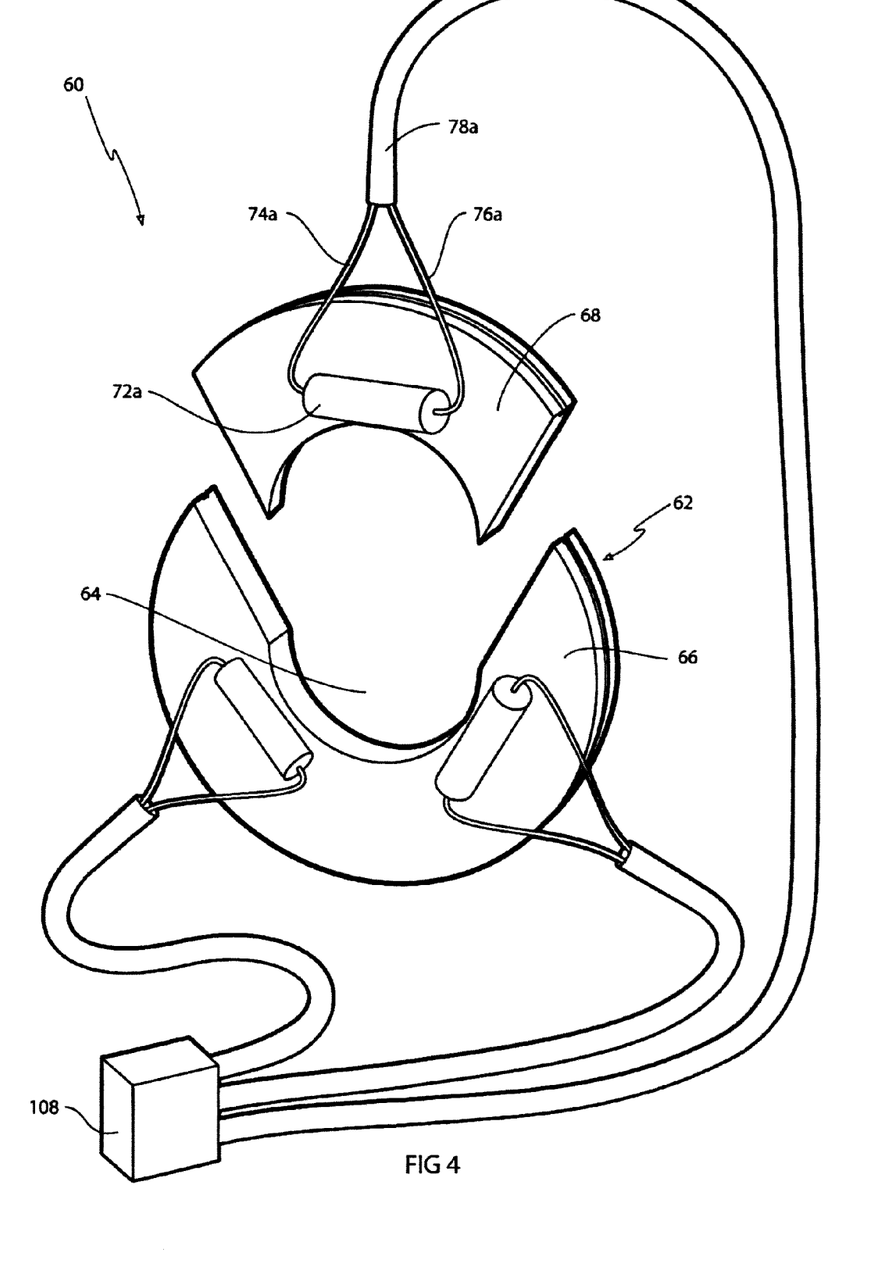
FIG. 4 is a 3D perspective view of an alternative holder for a Faraday optical current measurement system.

FIG. 4 shows a 3D perspective view of an alternative embodiment of a 3-phase measurement assembly 60 according to the present invention. The alternative embodiment comprises a single circular plate 62 defining a centrally located hole 64. The circular plate 62 may be separated into a primary section 66 and a secondary section 68. The primary section 66 corresponds to approximately 120 degrees of the single circular plate 62 and the secondary section 68 corresponds to approximately 240 degrees of the single circular plate 62. The primary and secondary sections 66, 68 may be separated when the measurement assembly 60 is installed and removed from the 3-phase cable.

A Faraday optical current sensor 72a is mounted on the surface of the circular plate 62 near the circular hole 64. An input optical conduit 74a and an output optical conduit 76a are attached to the Faraday optical current sensor 72a at a first end and an opposite second end, respectively. The input optical conduit 74a and the output optical conduit 76a extend outwards in a radial direction in relation to the circular plate 62 and are fed into a flexible hose 78a.

Figure 5:
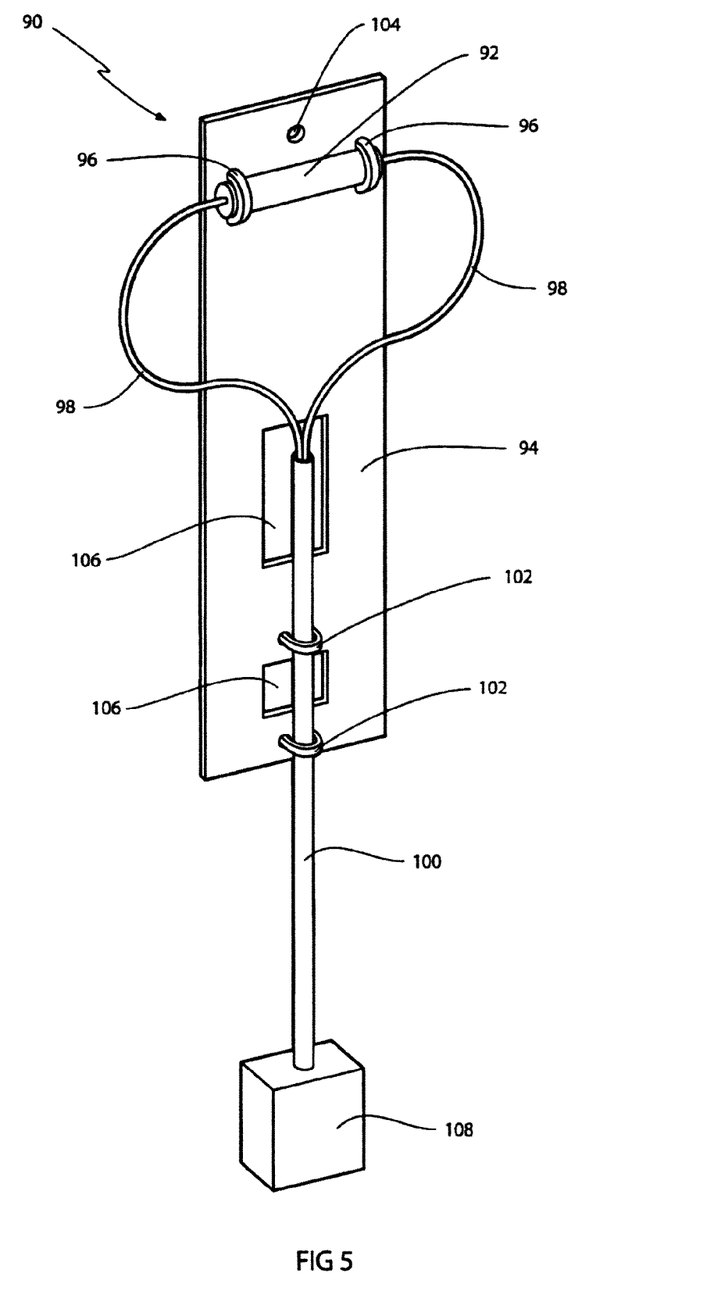
FIG. 5 is a 3D perspective view of yet another alternative holder for a Faraday optical current measurement system.

FIG. 5 shows a 3D perspective view of yet an alternative embodiment of a one phase measurement assembly according to the present invention. The one phase measurement assembly 90 comprises a Faraday optical current sensor 92 fixated onto a support plate 94 by the use of two fixation bands 96. The support plate 94 and the fixation band 96 should be made of magnetically transparent material. An optical conduit 98 extends from each side of the Faraday optical current sensor 92. The optical conduit 98 forms a loop shape and both ends of the optical conduit 98 are fed into a guiding hose 100. The guiding hose 100 is fixated onto the support plate 94 by the use of two fixation bands 102.

The support plate 94 further defines a circular fixation hole 104. The circular fixation hole 104 is preferably used for fixating the one phase measurement assembly 90 to a 3-phase cable by means of a band (not shown). The one phase measurement assembly 90 further defines two rectangular fixation holes 106 for fixating the support plate 94 to the 3-phase cable (not shown) by means of a band (not shown) in a substantially tangential position in relation to the elongation of the 3-phase cable. It is necessary to provide two additional one phase measurement assemblies 90 and fixate them on the 3-phase cable approximately 120 degrees apart and at the same radial and longitudinal distance on the 3-phase cable.

The details of FIGS. 1A, 3, 4 and 5 are summarized below:

10. Faraday optical current sensor assembly
12. Faraday optical current sensors
14. 3-phase cable
16. Conductor
18. High voltage insulation
20. Shield
22. Outer insulation
30. 3-phase measurement assembly
32. Circular plate
34. Centrally located hole
36. Primary section
38. Secondary section
40. Rectangular plate
42. Faraday optical current sensor
44. Input optical conduit
46. Output optical conduit
48. Flexible hose
50. Feed through hole
60. 3-phase measurement assembly
62. Circular plate
64. Circular hole
66. Primary section
68. Secondary section
72. Faraday optical current sensor
74. Input optical conduit
76. Output optical conduit
78. Flexible hose
90. One phase measurement assembly
92. Faraday optical current sensor
94. Support plate
96. Fixation band
98. Optical conduit
100. Guiding hose
102. Fixation band 104. Circular fixation hole
106. Rectangular fixation hole
108. Processing unit Thus there is provided a method of measuring the current in a 3-phase cable using a Faraday optical current sensor assembly. A system comprising a 3-phase Faraday optical current sensor assembly is also provided. Many modifications of the preferred embodiments of the invention disclosed herein will readily occur to those skilled in the art. Accordingly, the invention is intended to include all structure that falls within the scope of the claim.

The invention claimed is:

1. A method of measuring the current in a 3-phase cable comprising three individual section-shaped phase conductors insulated in relation to one another and encapsulated inside an insulator, the 3-phase cable defining a diameter, a longitudinal dimension along said 3-phase cable, and a radial dimension perpendicular to the longitudinal dimension, the method comprising:
providing a frame located outside of the insulator and spaced apart from the insulator;
providing a Faraday optical current sensor arrangement comprising three Faraday optical current sensors, each Faraday optical current sensor being fixed in a specific position on the frame outside of the insulator and spaced apart from the insulator;
providing a processing unit operable for calculating a current value from a magnetic field value input thereto;
measuring three magnetic field values by using each of the three Faraday optical current sensors; and
calculating a current value in each of the section-shaped phase conductors by using the processing unit with the three magnetic field values input thereto.

2. The method according to claim 1, wherein each of the Faraday optical current sensors defines an individual light propagation direction, and wherein the step of providing a Faraday optical current sensor arrangement includes:
(a) positioning the Faraday optical current sensors annularly spaced by a specific angle around the 3-phase cable at an equal distance in relation to the longitudinal dimension and oriented such that the light propagation direction of each of the Faraday optical current sensors is oriented perpendicular to both the longitudinal dimension and the radial dimension; and
(b) fixing the Faraday optical current sensors in a measurement position in which the arithmetic sum of the current values is maximized.

3. The method according to claim 1, wherein the frame comprises three plates, each plate having fixed thereto a Faraday optical current sensor.

4. The method according to claim 1, wherein the frame comprises a circular plate mounted on the 3-phase cable parallel to the radial dimension, the circular plate defining:
a centrally located hole configured and located for accommodating the 3-phase cable, the centrally located hole having a diameter approximately equal to the diameter of the 3-phase cable; and
a detachable section defining an angle of approximately 120 degrees;
wherein the three Faraday optical current sensors are fixed on the circular plate at approximately equal distances from the 3-phase cable.

5. The method according to claim 1, wherein the frame comprises:
first and second circular plates mounted on the 3-phase cable parallel to the radial dimension and separated by a specific distance along the longitudinal dimension, each circular plate defining:
a centrally located hole located and configured for accommodating the 3-phase cable, the centrally located hole having a diameter approximately equal to the diameter of the 3-phase cable; and
a detachable section defining an angle of approximately 120 degrees; and
three longitudinal plates each having a Faraday optical current sensor fixed thereto and extending between the first and second circular plates parallel to the longitudinal dimension, one of the longitudinal plates extending between the detachable sections of the first and second circular plates.

6. The method according to claim 1, wherein the Faraday optical current sensors are fixed at equal distances from the 3-phase cable in relation to the radial dimension.

7. The method according to claim 1, wherein the Faraday optical current sensors are fixed at equal distances from the 3-phase cable in relation to the longitudinal dimension.

8. The method according to claim 1, wherein the 3-phase cable comprises a shield surrounding the section-shaped phase conductors.

9. The method according to claim 1, wherein the 3-phase cable comprises a neutral conductor.

10. The method according to claim 1, wherein the Faraday optical current sensors are positioned annularly spaced by an angle of approximately 120 degrees around the 3-phase cable.

11. The method according to claim 10, wherein the current in the 3-phase cable is calculated by the processing unit using the following formula:

$$I_1 = \text{Gain}(a) \cdot \phi(a) \cdot I_s + \text{Gain}(a) \cdot \phi(-a) \cdot I_i$$

$$I_2 = \text{Gain}(a) \cdot b^2 \cdot \phi(a) \cdot I_s + \text{Gain}(a) \cdot b \cdot \phi(-a) \cdot I_i$$

$$I_3 = \text{Gain}(a) \cdot b \cdot \phi(a) \cdot I_s + \text{Gain}(a) \cdot b^2 \cdot \phi(-a) \cdot I_i$$

with $$b = \frac{1}{2} + j \cdot \frac{\sqrt{3}}{2},$$

$\phi(a) = \cos(f(a)) + j \cdot \sin(f(a))$ and $I_s$ and $I_i$ considered as vectors and where $I_s$ represents a synchronous system current, $I_i$ represents an inverse system current, Gain(a) represents a reduction factor depending on an offset angle, and $\phi$ is a phase shift.

12. A system for measuring the currents in a 3-phase cable comprising 3 individual section-shaped phase conductors insulated in relation to one another and encapsulated inside an insulator, the 3-phase cable defining a diameter, a longitudinal dimension along the 3-phase cable and a radial dimension perpendicular to the longitudinal dimension, the system comprising:
a frame located outside of the insulator and spaced apart from the insulator;
a Faraday optical current sensor arrangement comprising three Faraday optical current sensors, each operable for measuring a magnetic field value, each Faraday optical current sensor being fixed in a specific position on the frame outside of the insulator and spaced apart from the insulator; and a processing unit operable for calculating a current value in each of the section-shaped phase conductors in response to the input thereto of the magnetic field values from the three Faraday optical current sensors.

13. The system according to claim 12, wherein each of the Faraday optical current sensors defines an individual light propagation direction, and wherein the Faraday optical current sensors are annularly spaced by a specific angle around the 3-phase cable at an equal distance in relation to the longitudinal dimension and oriented such that the light propagation direction of each of the Faraday optical current sensors is oriented perpendicular to both the longitudinal dimension and the radial dimension; and wherein the Faraday optical current sensors are fixed in a measurement position in which the arithmetic sum of the current values is maximized.

14. The system according to claim 12, wherein the frame comprises three plates, each plate having fixed thereto a Faraday optical current sensor.

15. The system according to claim 12, wherein the frame comprises a circular plate mounted on the 3-phase cable parallel to the radial dimension, the circular plate defining:

a centrally located hole configured and located for accommodating the 3-phase cable, the centrally located hole having a diameter approximately equal to the diameter of the 3-phase cable; and a detachable section defining an angle of approximately 120 degrees;

wherein the three Faraday optical current sensors are fixed on the circular plate at approximately equal distances from the 3-phase cable.

16. The system according to claim 12, wherein the frame comprises:

first and second circular plates mounted on the 3-phase cable parallel to the radial dimension and separated by a specific distance along the longitudinal dimension, each circular plate defining:

a centrally located hole located and configured for accommodating the 3-phase cable, the centrally located hole having a diameter approximately equal to the diameter of the 3-phase cable; and a detachable section defining an angle of approximately 120degrees; and three longitudinal plates each having a Faraday optical current sensor fixed thereto and extending between the first and second circular plates parallel to the longitudinal dimension, one of the longitudinal plates extending between the detachable sections of the first and second circular plates.

17. The system according to claim 12, wherein the Faraday optical current sensors are fixed at equal distances from the 3-phase cable in relation to the radial dimension.

18. The system according to claim 12, wherein the Faraday optical current sensors are fixed at equal distances from the 3-phase cable in relation to the longitudinal dimension.

19. The system according to claim 12, wherein the 3-phase cable comprises a shield surrounding the section-shaped phase conductors.

20. The system according to claim 12, wherein the 3-phase cable comprises a neutral conductor.

21. The system according to claim 12, wherein the Faraday optical current sensors are positioned annularly spaced by an angle of approximately 120degrees around the 3-phase cable.

* * * * *